United States Patent
Lee et al.

(10) Patent No.: US 12,156,395 B2
(45) Date of Patent: Nov. 26, 2024

(54) METAL GATE PATTERNING FOR LOGIC AND SRAM IN NANOSHEET DEVICES

(71) Applicant: INTERNATIONAL BUSINESS MACHINES CORPORATION, Armonk, NY (US)

(72) Inventors: Choonghyun Lee, Chigasaki (JP); Takashi Ando, Eastchester, NY (US); Jingyun Zhang, Albany, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 406 days.

(21) Appl. No.: 17/644,076

(22) Filed: Dec. 13, 2021

(65) Prior Publication Data

US 2023/0189496 A1    Jun. 15, 2023

(51) Int. Cl.
*H10B 10/00* (2023.01)
*H01L 29/06* (2006.01)
*H01L 29/423* (2006.01)
*H01L 29/786* (2006.01)

(52) U.S. Cl.
CPC ....... *H10B 10/125* (2023.02); *H01L 29/0649* (2013.01); *H01L 29/0665* (2013.01); *H01L 29/42392* (2013.01); *H01L 29/78696* (2013.01)

(58) Field of Classification Search
CPC ... H10B 10/12; H10B 10/125; H01L 29/0649; H01L 29/0665; H01L 29/42392; H01L 29/78696

USPC ......................................................... 257/288
See application file for complete search history.

(56) References Cited

U.S. PATENT DOCUMENTS

| | | | |
|---|---|---|---|
| 9,871,099 B2 | 1/2018 | Pranatharthiharan | |
| 9,997,519 B1* | 6/2018 | Bao | H01L 27/092 |
| 10,103,065 B1 | 10/2018 | Mochizuki | |
| 10,410,933 B2* | 9/2019 | Xie | H01L 29/66545 |
| 10,566,248 B1 | 2/2020 | Chanemougame | |
| 10,573,521 B2 | 2/2020 | Wang | |
| 10,600,694 B2 | 3/2020 | Mochizuki | |
| 10,615,257 B2 | 4/2020 | Ok | |
| 10,622,466 B2 | 4/2020 | Ando | |
| 11,158,636 B2* | 10/2021 | Yeh | H01L 29/0665 |

* cited by examiner

*Primary Examiner* — Matthew E. Gordon
(74) *Attorney, Agent, or Firm* — Jeffrey Ingalls

(57) ABSTRACT

A semiconductor device is provided. The semiconductor device includes a first device including a first nanosheet stack formed on a substrate, the first nanosheet stack including alternating layers of a first work function metal (WFM) gate layer and an active semiconductor layer, a second nanosheet stack formed on the substrate, the second nanosheet stack including alternating layers of a second WFM gate layer and the active semiconductor layer, a shallow trench isolation (STI) region formed in the substrate between the first nanosheet stack and the second nanosheet stack, and an STI divot formed in the STI region. The first WFM gate layer of the first nanosheet stack is formed in the STI divot.

20 Claims, 7 Drawing Sheets

METAL GATE PATTERNING FOR LOGIC AND SRAM IN NANOSHEET DEVICES

BACKGROUND

The present disclosure relates to fabrication methods and resulting structures for semiconductor devices. More specifically, the present disclosure relates to fabrication methods and resulting structures for a metal gate patterning for semiconductor devices including static random-access memory (SRAM) and logic devices.

In certain semiconductor device fabrication processes, a large number of semiconductor devices, such as n-type field effect transistors (nFETs) and p-type field effect transistors (pFETs), may be fabricated on a single wafer. Non-planar transistor device architectures (e.g., fin-type FETs (FinFETs) and nanosheet FETs) can provide increased device density and increased performance over planar transistors. As semiconductor integrated circuits (ICs) and/or chips become smaller, the implementation of stacked nanosheets in semiconductor devices has increased. Nanosheets generally refer to two-dimensional nanostructures with a thickness range on the order of about 3 nanometer (nm) to about 20 nm, and they can facilitate the fabrication of non-planar semiconductor devices having a reduced footprint compared to conventional planar-type semiconductor devices. For example, nanosheet transistors, in contrast to conventional planar FETs, include a gate stack that wraps around the full perimeter of multiple stacked nanosheet channel regions for a reduced device footprint and improved control of channel current flow. Nanosheet transistor configurations may enable fuller depletion in the nanosheet channel regions and reduce short-channel effects. In addition, certain gate-all-around structures for FETs (e.g., nanosheet devices) may provide an improved electro-static control in order to meet the requirements for further device scaling. Accordingly, nanosheets and nanowires are seen as feasible options for reducing the footprints of semiconductor transistor devices to 7 nanometers or less.

In certain semiconductor devices, nanosheet devices are subjected to metal gate patterning processes. In devices that include both logic devices and SRAM devices, the logic devices may have a larger critical dimension (CD) than the SRAM devices. Controlling the amount of material that is removed during the metal gate patterning process for both the SRAM and logic devices may be a topic of interest.

SUMMARY

Embodiments of the present disclosure relate to a semiconductor device. The semiconductor device includes a first device including a first nanosheet stack formed on a substrate, the first nanosheet stack including alternating layers of a first work function metal (WFM) gate layer and an active semiconductor layer, a second nanosheet stack formed on the substrate, the second nanosheet stack including alternating layers of a second WFM gate layer and the active semiconductor layer, a shallow trench isolation (STI) region formed in the substrate between the first nanosheet stack and the second nanosheet stack, and an STI divot formed in the STI region. The first WFM gate layer of the first nanosheet stack is formed in the STI divot.

Other embodiments of the present disclosure relate to a method of manufacturing a semiconductor device. The method includes forming a first device by forming a first nanosheet stack on a substrate, the first nanosheet stack including alternating layers of a first work function metal (WFM) gate layer and an active semiconductor layer; forming a second nanosheet stack on the substrate, the second nanosheet stack including alternating layers of a second WFM gate layer and the active semiconductor layer; forming a shallow trench isolation (STI) region in the substrate between the first nanosheet stack and the second nanosheet stack; and forming an STI divot in the STI region. The first WFM gate layer of the first nanosheet stack is formed in the STI divot.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, explain the principles of the disclosure. The drawings are only illustrative of certain embodiments and do not limit the disclosure.

DETAILED DESCRIPTION

Figure 1:
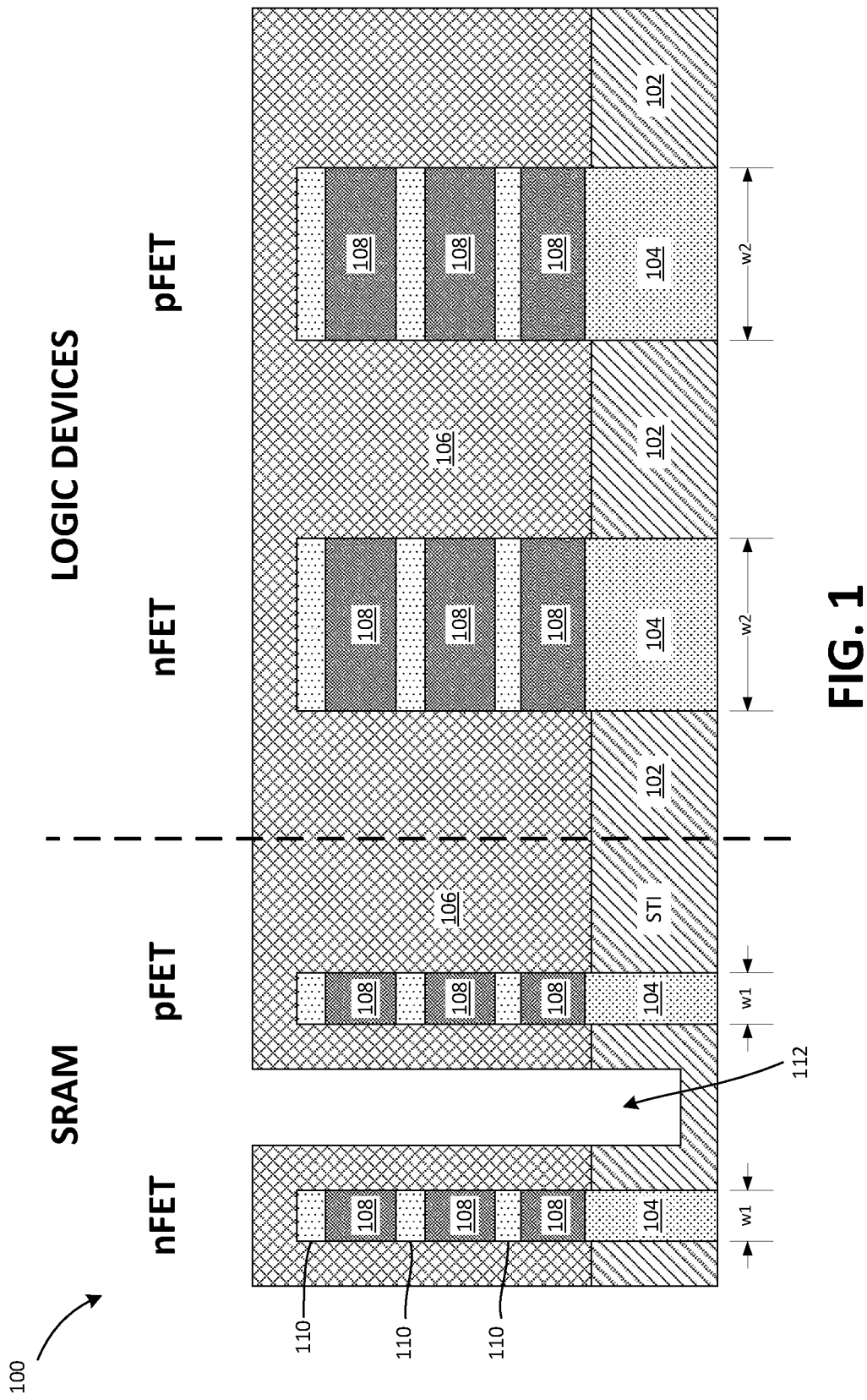
FIG. 1 is a cross-sectional view of a semiconductor device at an intermediate stage of the manufacturing process, according to embodiments.

The present disclosure describes nanosheet semiconductor devices and methods of manufacturing the semiconductor devices. In particular, the present disclosure describes metal gate patterning processes and devices including forming a trench in a shallow trench isolation (STI) region between nFET and pFET regions of an SRAM device. The present embodiments includes a method and structure to enable the metal gate patterning for both SRAM and logic devices, which have different nanosheet widths. In certain embodiments, a STI divot is formed between the nFET and pFET in a narrower nanosheet region to increase the etch distance of the metal gate during patterning. This may help in removing the p-type work function metal (WFM) from the nFET without incurring a WFM loss in the pFET side.

The flowcharts and cross-sectional diagrams in the Figures illustrate methods of manufacturing nanosheet FET devices according to various embodiments. In some alternative implementations, the manufacturing steps may occur in a different order that that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, gate-all-around FET devices (e.g., nanosheet devices) can provide for improved electro-static control in order to meet the requirements for further device scaling. The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. Semiconductor nanosheet FET devices typically include one or more suspended nanosheets that serve as the channel. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below.

An epitaxy process is typically performed to grow source/drain epitaxy structures from the surface of the wafer to contact the opposing ends of the nanosheets. A metal source/drain contact is then typically formed on the upper surface of the source/drain epitaxy structure to provide the final source/drain contacts of the device. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

However, certain nanosheet devices may suffer from problems associated with the metal gate patterning on SRAM and logic devices. In certain examples, where a semiconductor device includes both a logic device and an SRAM device, it is sometimes the case that the size (or critical dimension) of the logic device may be larger than that of the SRAM device. Because the logic device is larger than the SRAM device, it takes longer to remove material in the gate patterning step for the logic device. Thus, there could be a problem that the work function metal (WFM) (e.g., TiN) in the nanosheet device for the SRAM could be etched out during the metal gate patterning step. It should be appreciated that, more generally (i.e., than the example of SRAM and logic devices), the concepts in the present embodiments may be applied to any type of nanosheet devices where one type of device is larger than the other (e.g., the widths of the nanosheets are different) thus requiring different etching times (or even where the devices are the same size).

In general, static random-access memory (static RAM or SRAM) is a type of random-access memory (RAM) that uses latching circuitry (flip-flop) to store each bit. SRAM is volatile memory, and data is lost when power is removed. The term static differentiates SRAM from DRAM (dynamic random-access memory) which must be periodically refreshed. SRAM is faster and more expensive than DRAM, and it is typically used for the cache and internal registers of a CPU while DRAM is used for a computer's main memory. In general, a logic device is a semiconductor device that processes digital data in order to control the operations of some electronic system. Certain electronic devices may include both SRAM and logic devices, where both include nanosheet structures. During the manufacture of these types of devices, because the logic devices are generally larger than the SRAM devices, the etching time for the larger logic device is longer than that which would ordinarily be required to remove all the material from the smaller SRAM devices. Thus, there is a risk that too much of the gate material could be removed from the SRAM devices.

Referring now to the drawings in which like numerals represent the same or similar elements and initially to FIG. 1, an exemplary method of manufacturing an SRAM device to which the present embodiments may be applied is shown. In certain examples, several back end of line ("BEOL") layers (not shown) and front end of line (FEOL) layers (not shown) may be formed.

In general, the front end of line (FEOL) is the first portion of IC fabrication where the individual devices (transistors, capacitors, resistors, etc.) are patterned in the semiconductor. FEOL generally covers everything up to (but not including) the deposition of metal interconnect layers.

In general, the BEOL is the second portion of IC fabrication where the individual devices (transistors, capacitors, resistors, etc.) are interconnected with wiring on the wafer. The BEOL metal layers (not shown) can include, for example, Cu, TaN, Ta, Ti, TiN or a combination thereof. A BEOL dielectric layer (not shown) may be formed on the sides of one or more of the BEOL metal layers. The BEOL dielectric layer may be composed of, for example, $SiO_x$, $SiN_x$, SiBCN, low-κ, NBLOK, or any other suitable dielectric material. The structure including the FEOL/BEOL layers (not shown) may be a starting structure upon which the SRAM devices are formed.

As shown in the semiconductor device 100 of FIG. 1, a substrate 102 is provided. The substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate. The substrate 102 may be comprised of any other suitable material(s) than those listed above. The substrate 102 may include several shallow trench isolation (STI) regions including an insulating material (e.g., an oxide) to electrically isolate the different nFET and pFET regions. Bottom electrodes 104 are formed in the substrate of any suitable material(s) such as Si.

As shown in FIG. 1, a multi-layer nanosheet stack is formed on the substrate 102. The nanosheet stack includes a sacrificial layer 108, followed by the formation of an active semiconductor layer 110. In an example, the sacrificial layer 108 is composed of silicon-germanium (e.g., SiGe35, or more generally, where the Ge ranges from about 15-35%). In an example, the active semiconductor layer 110 is composed of silicon. Several additional layers of the sacrificial layer 108 and the active semiconductor layer 110 are alternately formed. In the example illustrated in FIG. 1, there are a total of three sacrificial layers 108 and three active semiconductor layers 110 that are alternately formed to form the nanosheet stack. However, it should be appreciated that any suitable number of alternating layers may be formed.

In certain embodiments, the sacrificial layers 108 have a vertical thickness ranging, for example, from approximately 3 nm to approximately 20 nm. In certain embodiments, the active semiconductor layers 110 have a vertical thickness ranging, for example, from approximately 3 nm to approximately 10 nm. Although six total layers are illustrated in FIG. 1, it should be appreciated that the nanosheet stack can include any suitable number of layers. Although the range of 3-20 nm is cited as an example range of thickness, other thicknesses of these layers may be used. In certain examples, certain of the sacrificial layers 108 or the active semiconductor layers 110 may have different thicknesses relative to one another. Therefore, multiple epitaxial growth processes can be performed to form the alternating sacrificial layers 108 and the active semiconductor layers 110.

After forming the alternating layers, nanosheet stacks are formed by any suitable patterning and material removal processes known to one of skill in the art. The semiconductor device 100 is subjected to a fin etching process to expose portions of the substrate 102. The fin etching process is achieved, for example, using a lithography patterning process (i.e., formation of a spacer (not shown)) followed by a directional reactive ion etch (RIE) process, which is capable of removing portions of the sacrificial layers 108 and the active semiconductor layers 110 not covered by the dummy gate (not shown) and the spacer (not shown). The RIE can use a boron-based chemistry or a chlorine-based chemistry, for example, which selectively recesses the exposed portions sacrificial layers 108 and the active semiconductor layers 110 without attacking the substrate 102. In certain embodiments, a dielectric isolation layer (not shown) may also be formed between the nanosheet stack and the substrate 102.

As shown in the example of FIG. 1, an SRAM device is formed on the left side of the figure. In an example, the SRAM device has a first nanosheet width w1 of 15 nm. However, it should be appreciated that any other suitable width may be used for the SRAM device. The SRAM device includes an nFET region and a pFET region. As shown in the example of FIG. 1, a logic device is formed on the right side of the figure. In an example, the logic device has a second nanosheet width w2 of 50 nm. However, it should be appreciated that any other suitable width may be used for the logic device. The logic device also includes an nFET and a pFET region. In certain embodiments, it may be desirable to have a small vertical spacing (VSP) between adjacent nanosheet layers in a stack of nanosheets to reduce the parasitic capacitance and to improve circuit speed. For example, the VSP (the distance between the bottom surface of a first nanosheet layer and the top surface of an adjacent second nanosheet layer) may range from 5 nm to 15 nm. However, the VSP must be of a sufficient value to accommodate the gate stack that will be formed in the spaces created by later removal of the sacrificial layers 108.

As also shown in FIG. 1, an organic planarization (OPL) layer 106 is initially formed over the entire substrate 102 (i.e., initially formed over the nFET and pFET regions). After the formation of the OPL layer 106, an STI divot 112 is formed in the substrate 102 only in the SRAM region. The STI divot 112 is formed, in this example, partially through the substrate 102.

Figure 2:
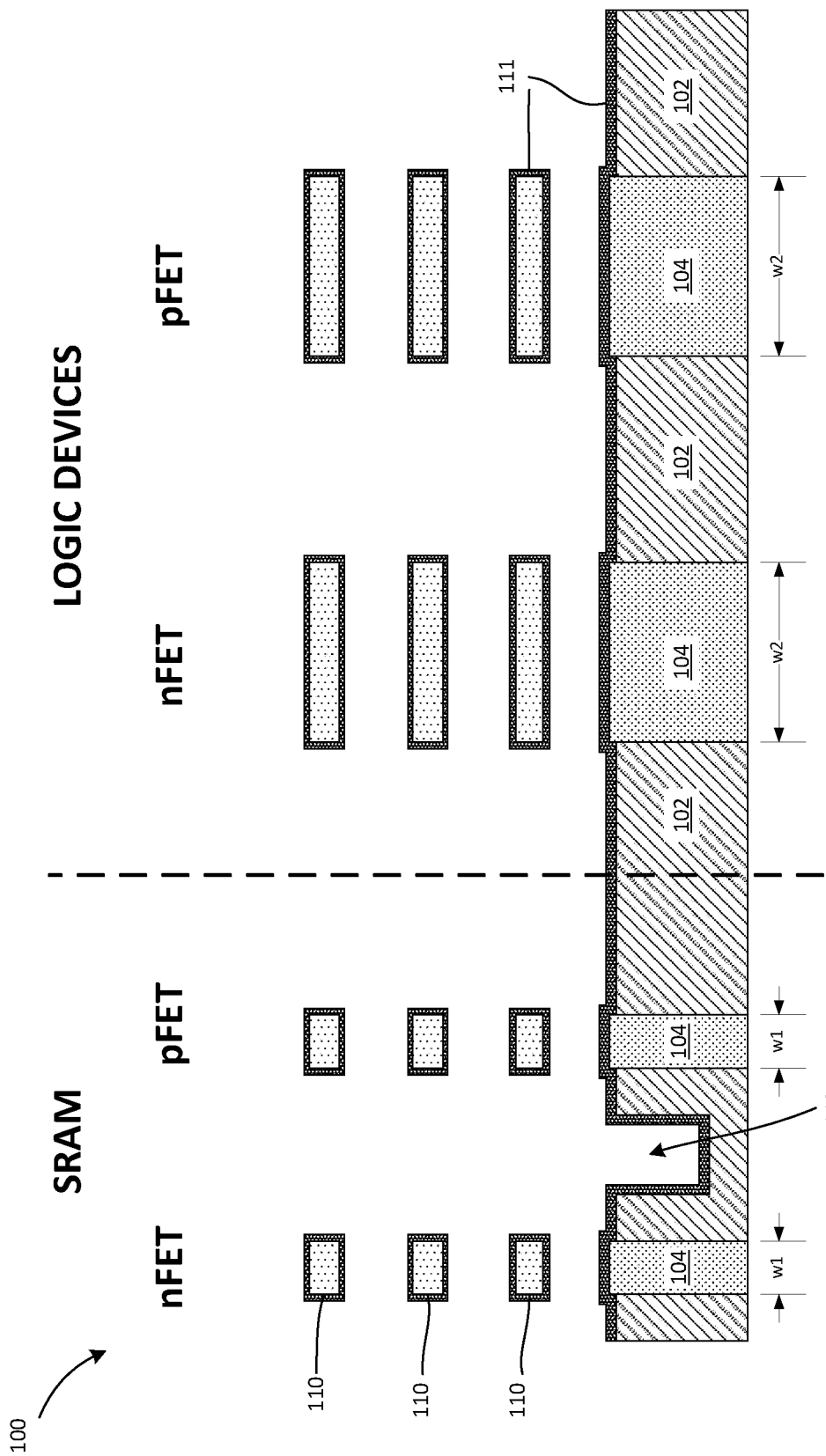
FIG. 2 is a cross-sectional view of the semiconductor device of FIG. 1 after additional fabrication operations, according to embodiments.

Referring now to FIG. 2, this figure is a cross-sectional view of the semiconductor device 100 of FIG. 1 after additional operations, according to embodiments. As shown in FIG. 2, the sacrificial layers 108 are removed by any suitable material removal process known to one of skill in the art. Then, a high-κ layer 111 is formed on the exposed surfaces of the active semiconductor layers 110, on the exposed surface of the bottom electrode 104, and on the exposed surfaces of the substrate 102 (including the regions where the STI divot 112 is formed). In certain examples, an interfacial layer (IL) (not shown) may be formed prior to the formation of the high-κ layer 111.

Figure 3:
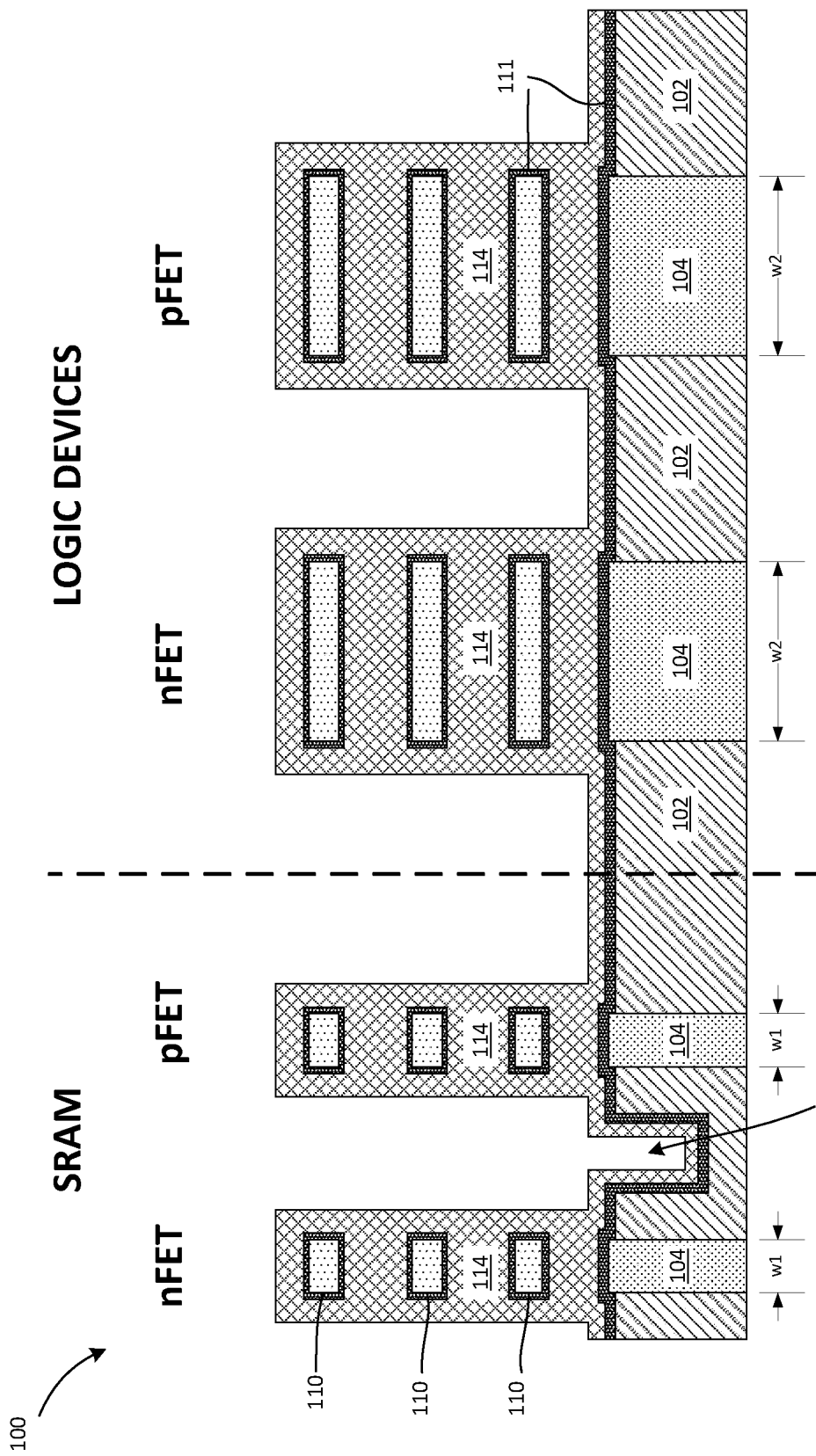
FIG. 3 is a cross-sectional view of the semiconductor device of FIG. 2 after additional fabrication operations, according to embodiments.

Referring now to FIG. 3, this figure is a cross-sectional view of the semiconductor device 100 of FIG. 2 after additional operations, according to embodiments. In certain embodiments, the gate stack (or nanosheet stack) generally includes a work function metal (WFM) that sets the threshold voltage (Vt) of the device, a high-κ gate dielectric material (e.g., the high-κ layer 111) separating the WFM from the nanosheets, and other metals that may be desired to further fine tune the effective work function (eWF) and/or to achieve a desired resistance value associated with current flow through the gate stack in the direction parallel to the plane of the nanosheets. As shown in FIG. 3, a first metal gate 114 is formed to fill in the spaces between the active semiconductor layers 110 and in the STI divot 112. Note that in this example, the STI divot 112 is only partially filled with the first metal gate 114, and this makes the effective length of the first metal gate 114 between the nFET and the pFET of the SRAM device much longer. In certain examples, the first metal gate 114 is a pFET WFM such as TiN. However, it should be appreciated that other suitable materials may be used. Also, it should be appreciated that the material of the first metal gate 114 could be a suitable nFET WFM material as opposed to a pFET WFM material. Initially, the first metal gate 114 is formed in both the pFET regions and nFET regions of the nanosheet stack. However, as will be described below, the first metal gate 114 is later removed in the nFET region. In certain embodiments, the first metal gate 114 may be comprised of, for example, TiN formed by an atomic layer deposition (ALD) technique and/or TiN deposited by a chemical vapor deposition (CVD) technique.

Figure 4:
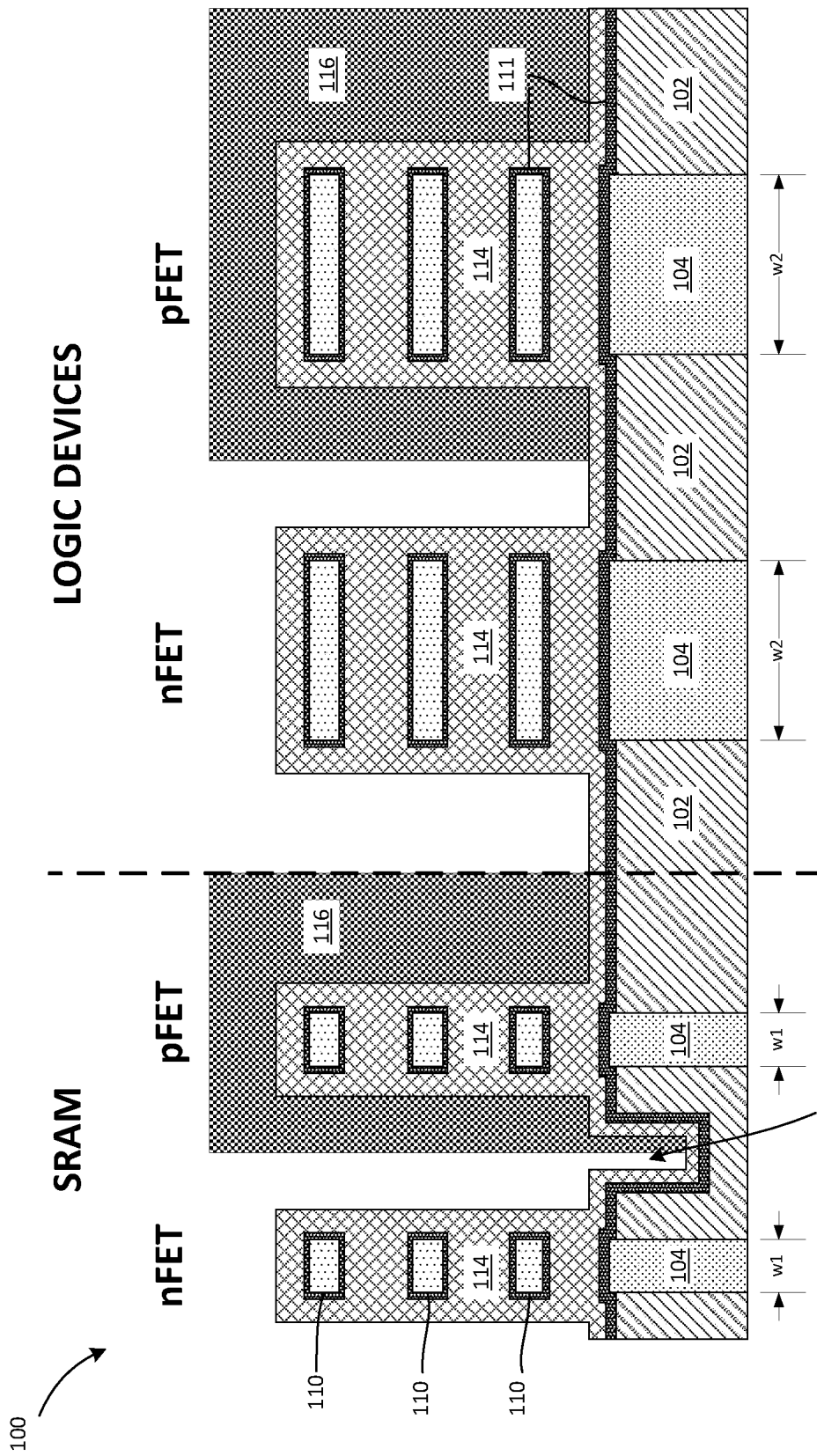
FIG. 4 is a cross-sectional view of the semiconductor device of FIG. 3 after additional fabrication operations, according to embodiments.

Referring now to FIG. 4, this figure is a cross-sectional view of the semiconductor device 100 of FIG. 3 after additional operations, according to embodiments. As shown in FIG. 4, a second OPL layer 116 is formed over the pFET regions of the SRAM device and the logic device. As shown in FIG. 4, a portion of the remaining open space in the STI divot 112 is filled with the second OPL layer 116.

Figure 5:
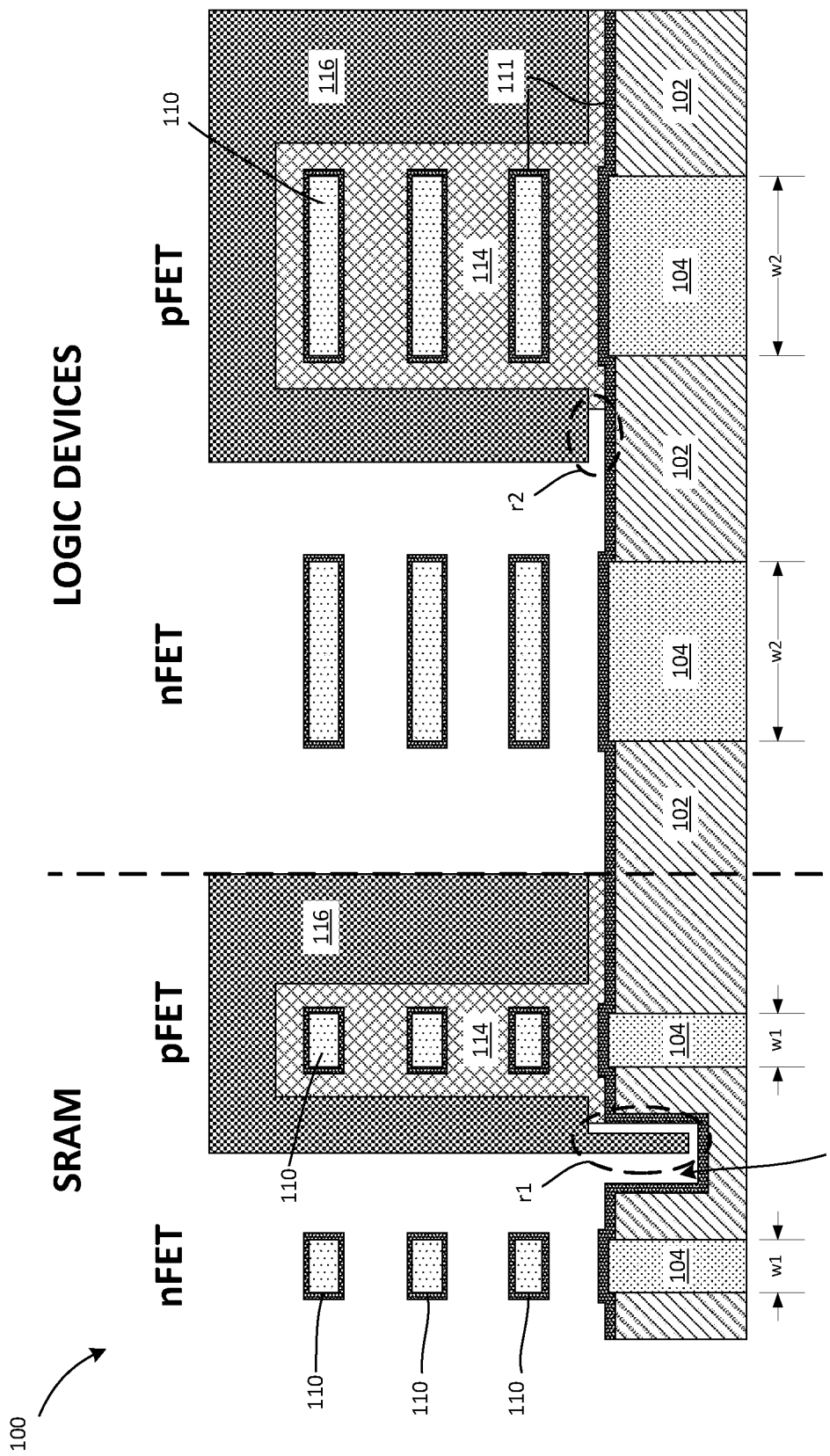
FIG. 5 is a cross-sectional view of the semiconductor device of FIG. 4 after additional fabrication operations, according to embodiments.

Referring now to FIG. 5, this figure is a cross-sectional view of the semiconductor device 100 of FIG. 4 after additional operations, according to embodiments. As shown in FIG. 5, metal gate patterning is performed to remove the pFET material of the first metal gate 114 from the nFET sides of both the SRAM device and the logic device. Any suitable material removal process such as wet etching (e.g., SC1) may be used to completely remove the first metal gate 114 from the nFET sides. As shown in the r2 region of FIG. 5, some of the material of the first metal gate 114 underneath the second OPL layer 116 on the pFET side of the logic device may be removed. However, due to the relatively larger CD of the logic device, the etching process is stopped before any material of the first metal gate 114 surrounding the active semiconductor layers 110 of the pFET side of the logic device is etched. As shown in the r1 region of FIG. 5, some of the material of the first metal gate 114 underneath the second OPL layer 116 on the pFET side of the logic device may be removed. However, even though the nanosheet stacks of the SRAM device may be significantly smaller than those of the logic device, the effective length of the first metal gate 114 is longer due to the horizontal and vertical distances of the first metal gate 114 in the STI divot 112 (i.e., region r1). Thus, even in the smaller SRAM region, the etching process is stopped before any material of the first metal gate 114 surrounding the active semiconductor layers 110 of the pFET side of the logic device is etched. As such, the STI divot 112 allows a long enough etching path of the first metal gate 114 so that all of the material of the first metal gate 114 on both the nFET side of the SRAM device and the nFET side of the logic device can be removed without attacking the active material of the either of the nanosheet stacks of the pFET sides.

Figure 6:
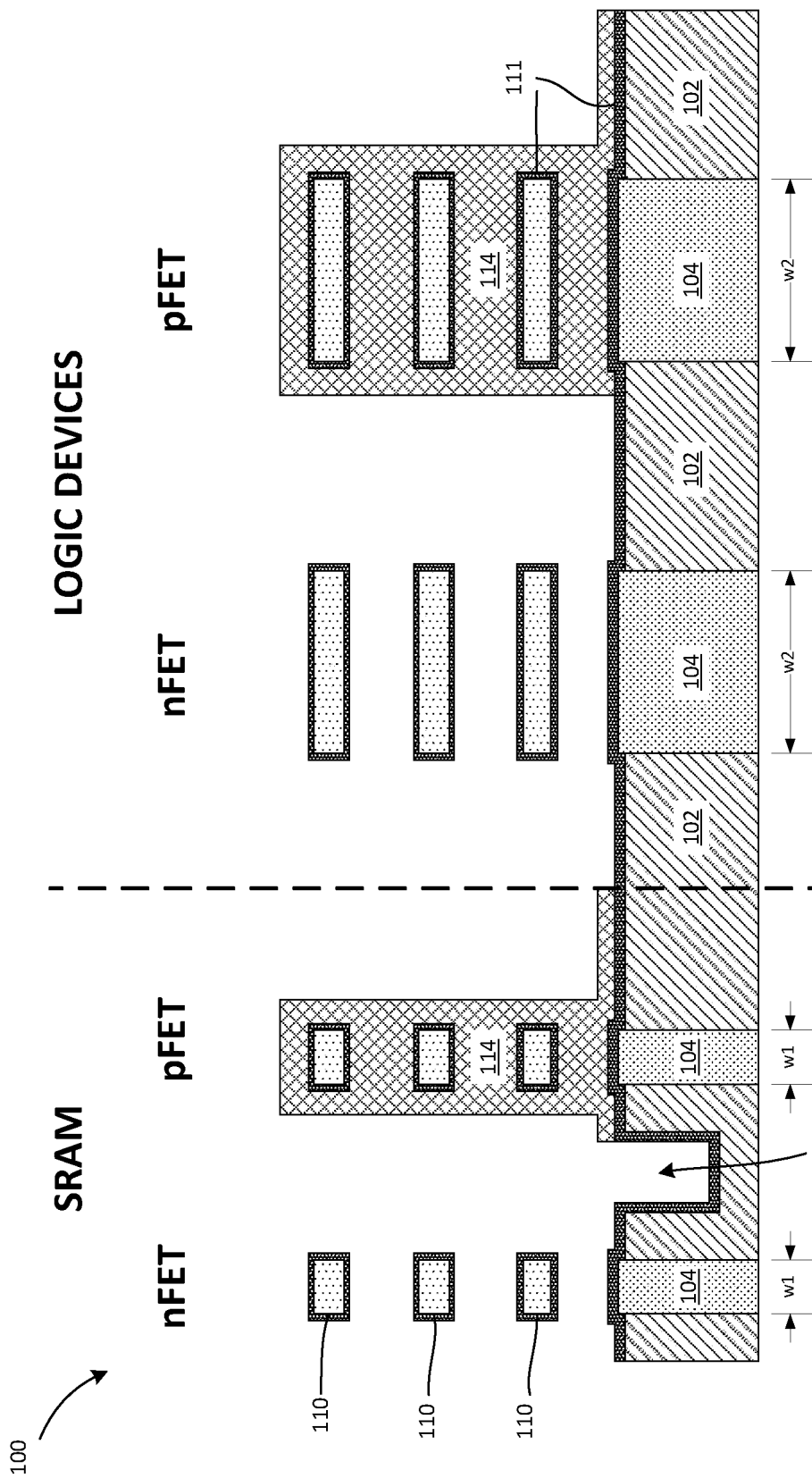
FIG. 6 is a cross-sectional view of the semiconductor device of FIG. 5 after additional fabrication operations, according to embodiments.

Referring now to FIG. 6, this figure is a cross-sectional view of the semiconductor device 100 of FIG. 5 after additional operations, according to embodiments. As shown in FIG. 6, the second OPL layer 116 is removed. In one example, the second OPL layer 116 may be removed with plasma etching (e.g., a $N_2/H_2$ ashing process).

Figure 7:
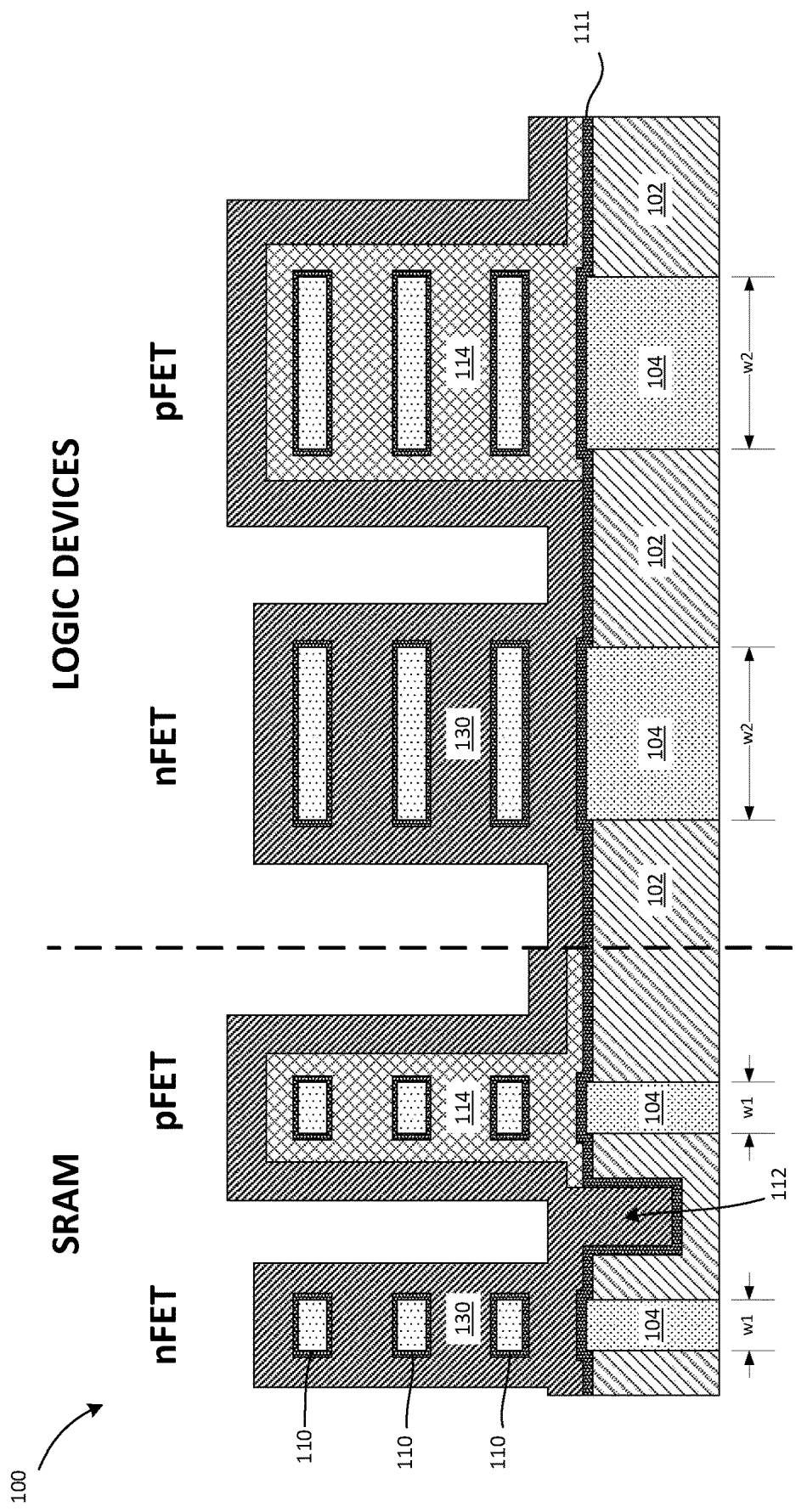
FIG. 7 is a cross-sectional view of the semiconductor device of FIG. 6 after additional fabrication operations, according to embodiments.

Referring now to FIG. 7, this figure is a cross-sectional view of the semiconductor device 100 of FIG. 6 after additional operations, according to embodiments. As shown in FIG. 7, after the removal of the second OPL layer 116, a second metal gate 130 is deposited. The second metal gate 130 is formed to fill in the spaces between the active semiconductor layers 110 and in the STI divot 112. Note that in this example, the STI divot 112 is filled in with the second metal gate 130. In certain examples, the second metal gate 130 is a nFET WFM such as TiN/TiAlC/TiN. However, it should be appreciated that other suitable materials may be used. Also, it should be appreciated that the material of the second metal gate 130 could be a suitable pFET WFM material as opposed to an nFET WFM material. Although not shown in FIG. 7, in certain examples, the second metal gate 130 could subsequently be removed from the pFET side of both the SRAM devices and the logic devices.

Thus, in the present embodiments, the STI divot 112 allows a longer etching path of the first metal gate 114 so that all of the material of the first metal gate 114 on both the nFET side of the SRAM device and the nFET side of the logic device can be removed without attacking the active material of the either of the nanosheet stacks of the pFET sides. As such, the structural and functional integrity of the smaller SRAM nanosheet gate stack may be maintained.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
  a first device including:
    a first nanosheet stack formed on a substrate, the first nanosheet stack including alternating layers of a first work function metal (WFM) gate layer and an active semiconductor layer;
    a second nanosheet stack formed on the substrate, the second nanosheet stack including alternating layers of a second WFM gate layer and the active semiconductor layer;
    a shallow trench isolation (STI) region formed in the substrate between the first nanosheet stack and the second nanosheet stack; and
    an STI divot formed in the STI region,
    wherein at least part of the first WFM gate layer of the first nanosheet stack is formed in the STI divot.

2. The semiconductor device according to claim 1, wherein the first WFM gate layer is a n-type WFM and the second WFM gate layer is an p-type WFM.

3. The semiconductor device according to claim 1, further comprising a high-K layer formed on the active semiconductor layers.

4. The semiconductor device according to claim 1, wherein the first device is a static random-access memory (SRAM) device.

5. The semiconductor device according to claim 4, further comprising a second device including a third nanosheet stack formed on the substrate, the third nanosheet stack including alternating layers of the first WFM gate layer and the active semiconductor layer, and a fourth nanosheet stack formed on the substrate, the fourth nanosheet stack including alternating layers of the second WFM gate layer and the active semiconductor layer, wherein a width of the first device is less than a width of the second device.

6. The semiconductor device according to claim 5, wherein the second device is a logic device.

7. The semiconductor device according to claim 1, wherein the active semiconductor layer comprises Si.

8. The semiconductor device according to claim 1, wherein the second WFM gate layer comprises TiN.

9. The semiconductor device according to claim 1, wherein the first WFM gate layer is also formed on the second WFM gate layer.

10. The semiconductor device according to claim 1, wherein the first WFM gate layer comprises TiN/TiAlC/TiN.

11. A method of manufacturing a semiconductor device, the method comprising:
  forming a first device by:
    forming a first nanosheet stack on a substrate, the first nanosheet stack including alternating layers of a first work function metal (WFM) gate layer and an active semiconductor layer;
    forming a second nanosheet stack on the substrate, the second nanosheet stack including alternating layers of a second WFM gate layer and the active semiconductor layer;
    forming a shallow trench isolation (STI) region in the substrate between the first nanosheet stack and the second nanosheet stack; and
    forming an STI divot in the STI region,
    wherein at least part of the first WFM gate layer of the first nanosheet stack is formed in the STI divot.

12. The method according to claim 11, wherein the first WFM gate layer is a n-type WFM and the second WFM gate layer is an p-type WFM.

13. The method according to claim 11, further comprising forming a high-K layer on the active semiconductor layers.

14. The method according to claim 11, wherein the first device is a static random-access memory (SRAM) device.

15. The method according to claim 14, further comprising forming a second device by
  forming a third nanosheet stack on the substrate, the third nanosheet stack including alternating layers of the first WFM gate layer and the active semiconductor layer, and
  forming a fourth nanosheet stack on the substrate, the fourth nanosheet stack including alternating layers of the second WFM gate layer second and the active semiconductor layer,
  wherein a width of the first device is less than a width of the second device.

16. The method according to claim 15, wherein the second device is a logic device.

17. The method according to claim 11, wherein forming the second WFM gate layer includes:
  forming the second WFM gate layer around the active semiconductor layer of the first and second nanosheet stacks and in the STI divot;
  forming an organic planarization layer to cover the second nanosheet stack and to cover a portion of the WFM gate layer in the STI divot; and removing a portion of the second WFM gate layer around the active semiconductor layer of the first nanosheet stack and in the STI divot.

18. The method according to claim 11, wherein the second WFM gate layer comprises TiN.

19. The method according to claim 11, wherein the first WFM gate layer is also formed on the second WFM gate layer.

20. The method according to claim 11, wherein the first WFM gate layer comprises TiN/TiAlC/TiN.

* * * * *